(12) United States Patent
Malik

(10) Patent No.: US 7,098,695 B2
(45) Date of Patent: Aug. 29, 2006

(54) DYNAMIC-TO-STATIC LOGIC CONVERTER

(75) Inventor: Khurram Zaka Malik, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 10/881,535

(22) Filed: Jun. 30, 2004

(65) Prior Publication Data

US 2006/0001451 A1    Jan. 5, 2006

(51) Int. Cl.
*H03K 19/096* (2006.01)
(52) U.S. Cl. ............................................ 326/95; 326/93
(58) Field of Classification Search .................. 326/93, 326/95; 327/218
See application file for complete search history.

(56) References Cited

U.S. PATENT DOCUMENTS 5,900,759 A * 5/1999 Tam ............................ 327/201
6,130,557 A * 10/2000 Drapkin et al. ................ 326/81
6,693,459 B1 * 2/2004 Nedovic et al. ............... 326/93
6,825,694 B1 * 11/2004 Yoo ............................. 326/95

\* cited by examiner

*Primary Examiner*—James H. Cho
(74) *Attorney, Agent, or Firm*—Philip R Wadsworth; Charles D. Brown; Kenyon S. Jenckes

(57) ABSTRACT

This disclosure is directed to techniques for reducing erroneous static logic signals when logic signals change relative to a clock signal within a dynamic to static logic converter circuit. Domino logic circuits, for example, utilize dynamic logic signals evaluated relative to a clocking signal. When dynamic logic signals are evaluated, logic signals propagate within logic circuits. Dynamic to static logic converter circuits possess logic signals used to generate static logic signals that change state at well defined points in time relative to a clocking signal used by dynamic logic. Use of a delay for a clocking signal by a latch circuit utilized to capture a dynamic logic signal for conversion to a static logic signal reduces logic level changes in static logic signals during times in which dynamic logic signals may be indeterminate. Use of current limiting circuit elements associated with the latch circuit may further reduce logic level changes during these times in which dynamic logic signals may be indeterminate.

13 Claims, 5 Drawing Sheets

DYNAMIC-TO-STATIC LOGIC CONVERTER

TECHNICAL FIELD

The disclosure relates to digital logic circuits and more specifically to dynamic logic circuit designs.

BACKGROUND

Dynamic logic circuit designs are utilized in integrated circuit design to realize increases in digital circuit operating frequencies as compared to static logic circuit designs. Domino logic circuits represent a class of dynamic logic circuits. A single domino logic gate circuit design typically includes an NMOS pull-down network, two or more clock-controlled transistors, and a static logic gate which is used as a buffer between dynamic nodes within successive domino logic gate circuits. The domino logic gate circuit pre-charges the dynamic node of the static gate to a logic high state during a first phase of a clock signal used to clock the clock-controlled transistors, typically when the clock signal is low. The domino logic gate circuit subsequently evaluates the logic gate in a second phase of the clock signal. In particular, the dynamic node either discharges or retains its pre-charged state depending upon values of input signals applied to the logic gate.

A dynamic-to-static converter circuit is used within integrated circuits to convert dynamic logic circuit signals based upon a clock signal to static logic circuit signals for use within the integrated circuit. The dynamic-to-static converter circuit includes a dynamic logic gate circuit and a latch circuit in which an output signal from the latch circuit represents the converted static logic signal. Both the dynamic logic gate circuit and the latch circuit are controlled by a common clock signal such that the latch captures a current value of the dynamic logic gate output at a proper point of time within the dynamic logic timing cycle.

Unfortunately, the use of a common clock signal, as is typically utilized within stages of dynamic logic circuits, may permit the output signal generated by the latch circuit to briefly propagate an erroneous representation of the dynamic logic gate output under certain conditions. When the common clock signal is used to drive evaluation of a pre-charged dynamic logic gate and at the same time enable the latch circuit to capture the value of the signal value from the dynamic logic gate, a signal input to the latch circuit may observe and propagate an erroneous logic value for the dynamic logic gate circuit during a brief period of time while the logic signal is still under evaluation by the dynamic logic circuit. The erroneous logic value may appear to subsequent logic circuits receiving an output signal from the dynamic-to-static converter circuit as a signal glitch. This signal glitch can cause a functional failure if it propagates out of the latch and is sampled by a sequential element. In addition, the glitch may result in wasted power consumption due to unnecessary latch activity incident to the glitch. Hence, this signal glitch can present design issues for the subsequent logic circuits that make use of the static logic signal without the aid of a clock signal.

SUMMARY

In general, the disclosure is directed to techniques for reducing the output of erroneous static logic signals, or signal "glitches," from a dynamic to static logic converter circuit. A dynamic to static logic converter circuit includes a dynamic logic circuit and a latch circuit. A common clock signal drives both an evaluation gate in the dynamic logic circuit and a pull-down gate in the latch circuit. The evaluation gate evaluates the pre-charged dynamic output of the dynamic logic circuit. The pull-down gate samples the dynamic node upon evaluation. A delay element is provided to delay the common clock signal applied to the pull-down gate of the latch circuit to eliminate signal glitches. In this manner, the latch circuit is enabled after completion of the evaluation phase of the dynamic logic circuit, avoiding capture of an erroneous logic signal during the evaluation phase.

In addition, in some embodiments, the dynamic to static logic converter circuit may include a current limiting circuit that limits current to the latch circuit when the evaluation gate is in the evaluation phase. In this manner, the latch circuit is current starved in the event the pull-down gate in the latch circuit is somehow enabled during the evaluation phase, despite the clock delay, thereby eliminating or reducing the magnitude of any signal glitch. As an example, the dynamic logic circuit and the latch circuit may share a common tail device, coupling both the evaluation gate and the pull-down gate to ground. The common tail device ensures that the latch circuit is current starved in the event the pull-down gate is enabled during the evaluation stage of the evaluation gate.

In one embodiment, the disclosure is directed to a dynamic-to-static logic converter circuit comprising a dynamic logic circuit that generates a dynamic logic signal in response to a clock signal, a clock delay element that delays the clock signal, and a latch circuit that samples the dynamic logic signal to generate a static logic signal in response to the delayed clock signal.

In another embodiment, the disclosure is directed to a method for converting a dynamic logic signal to a static logic signal, the method comprising generating a dynamic logic signal in response to a clock signal, delaying the clock signal, and sampling the dynamic logic signal in response to the delayed clock signal to generate a static logic signal.

In another embodiment, the disclosure is directed to a memory circuit having a dynamic-to-static logic converter circuit. The dynamic-to-static logic converter circuit comprising a dynamic logic circuit that generates a dynamic logic signal in response to a clock signal, a clock delay element that delays the clock signal, and a latch circuit that samples the dynamic logic signal to generate a static logic signal in response to the delayed clock signal.

In another embodiment, the disclosure is directed to a digital signal processing circuit having a dynamic-to-static logic converter circuit. The dynamic logic circuit that generates a dynamic logic signal in response to a clock signal, a clock delay element that delays the clock signal, and a latch circuit that samples the dynamic logic signal to generate a static logic signal in response to the delayed clock signal.

The details of one or more embodiments are set forth in the accompanying drawings and the description below. Other features, objects, and advantages will be apparent from the description and drawings, and from the claims.

DETAILED DESCRIPTION

Figure 1:
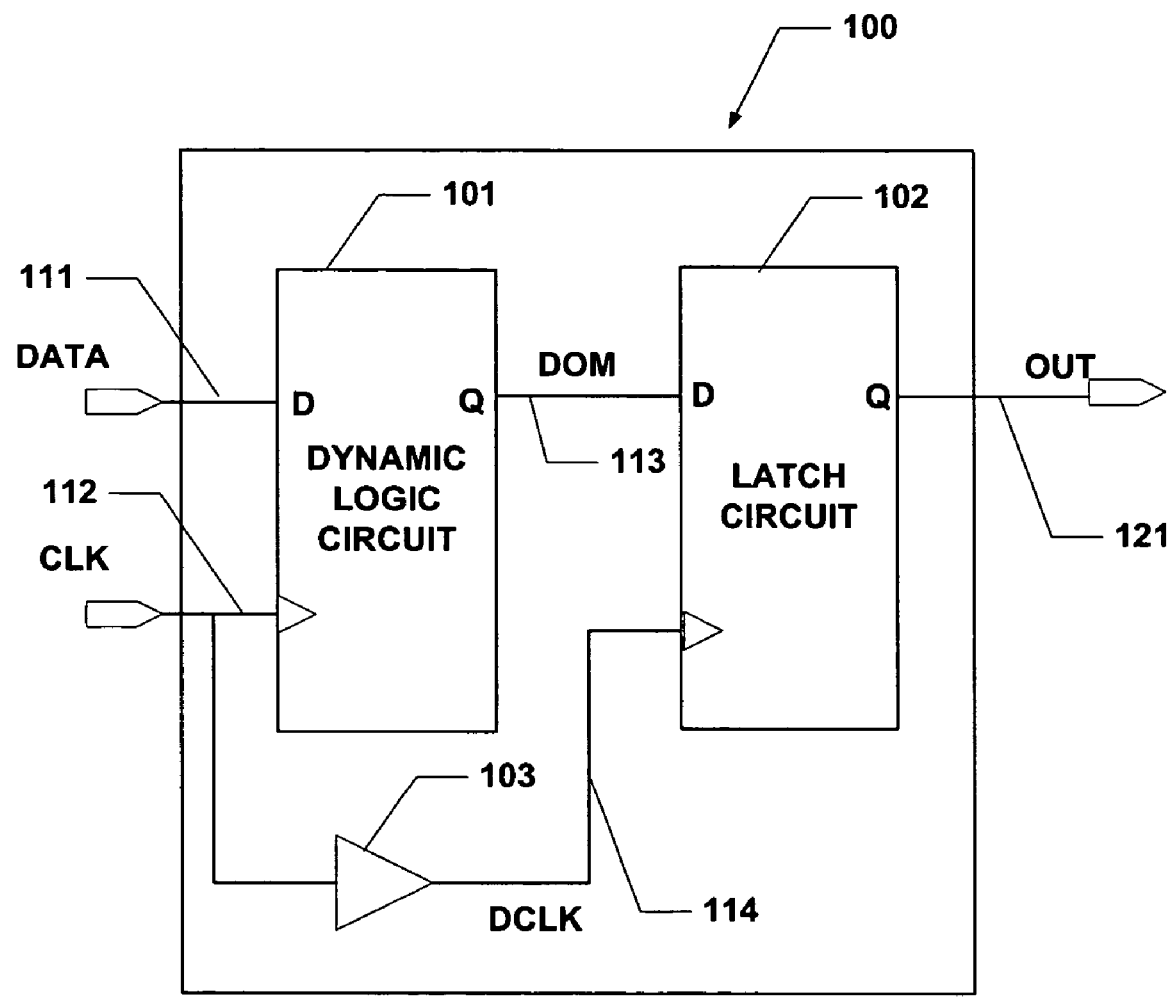
FIG. 1 is a block diagram illustrating one embodiment of a dynamic-to-static logic converter circuit.

FIG. 1 is a block diagram illustrating an embodiment of a dynamic-to-static converter circuit 100. As shown in FIG. 1, dynamic-to-static converter circuit 100 comprises a dynamic logic circuit 101, a latch circuit 102 and a clock delay element 103. A dynamic-to-static converter circuit 100, as described herein, may be especially useful as a domino-to-static converter circuit. Accordingly, in some embodiments, dynamic logic circuit 101 may comprise a domino inverter stack, while latch circuit 102 may comprise a tri-state latch stack. Dynamic logic circuit 101 will be described in the context of domino logic for purposes of illustration, but may be readily adapted for other dynamic logic applications. Dynamic logic circuit 101 is coupled to transmit a dynamic logic signal to an input of latch circuit 102.

Clock delay element 103 receives an input clock (CLK) signal 112 that drives gates within dynamic logic circuit 101. In particular, input clock (CLK) signal 112 drives pre-charges and evaluates logic gates within the domino inverter stack based upon an input data (DATA) signal 111. Input clock (CLK) signal 112, corresponds to an alternating high and low signal typically having a duty cycle of 50%. Clock delay element 103 generates a delayed version of the input clock signal. The delayed clock (DCLK) signal 114 serves as a sampling clock signal that is used to enable and capture a dynamic output (DOM) signal 113 from dynamic logic circuit 101 within latch circuit 102. A static logic output (OUT) signal 121, from tri-state latch stack module 102 represents the output of digital-to-static converter circuit 100.

Prior art digital-to-static logic converters can suffer from a signal glitch capable of disrupting performance. Prior art domino logic circuits typically use a common clocking signal to pre-charge, evaluate, and capture logic signals during both pre-charge and evaluation phases of a domino logic clock cycle. In a prior art domino-to-static converter, a tri-state latch stack begins capturing dynamic output (DOM) signal 113 using the same clock signal used to evaluate the domino inverter stack. As a result, under certain conditions, a prior art tri-state latch stack may begin enabling the capture of dynamic output (DOM) signal 113 prior to evaluation of input data (DATA) signal 111 by dynamic logic circuit 101.

During a pre-charge phase of a domino logic clock cycle, dynamic output (DOM) signal 113 is pre-charged to a logic high level. During an evaluation phase of a dynamic logic clock cycle, dynamic output (DOM) signal 113 either remains high or falls to a low signal level, depending on input data (DATA) signal 111. In particular, when input data (DATA) signal 111 is at a logic high level, dynamic output (DOM) is high. When input data (DATA) signal 111 is at logic low level, dynamic output (DOM) signal is at a logic low level. In either case, the dynamic output (DOM) signal is initially pre-charged to a logic high level. During the evaluation phase, a prior art tri-state latch stack is enabled and can receive an incorrect and changing dynamic output (DOM) signal 113, resulting in a signal glitch.

In accordance with this disclosure, and in contrast to prior art dynamic-to-static logic converters, dynamic-to-static logic converter 100 includes clock delay element 103 to prevent the signal glitch. In particular, clock delay element 103 delays the input CLK signal 112 to generate a delayed clock (DCLK) signal 114 that serves as an a sampling clock for latch circuit 102. The delayed clock (DCLK) signal 114 causes latch circuit 102 to begin sampling dynamic output (DOM) signal 113 after a delay period that is greater than the length of the evaluation phase by dynamic logic circuit 101, so that dynamic output (DOM) signal 113 has fallen to the low level by the time it is sampled. In this manner, with delayed clock (DCLK) signal 114, latch circuit 102 can avoid sampling dynamic output (DOM) signal 113 during the evaluation phase. As a result, latch circuit 102 does not sample dynamic output (DOM) signal 113 as it falls from its pre-charged state to an evaluated low state, and does not temporarily propagate an erroneous static logic output (OUT) signal 121. On the contrary, clock delay element 103 ensures that latch circuit 102 samples dynamic output (DOM) signal 113 after it has been evaluated by digital inverter circuit 101.

Figure 2:
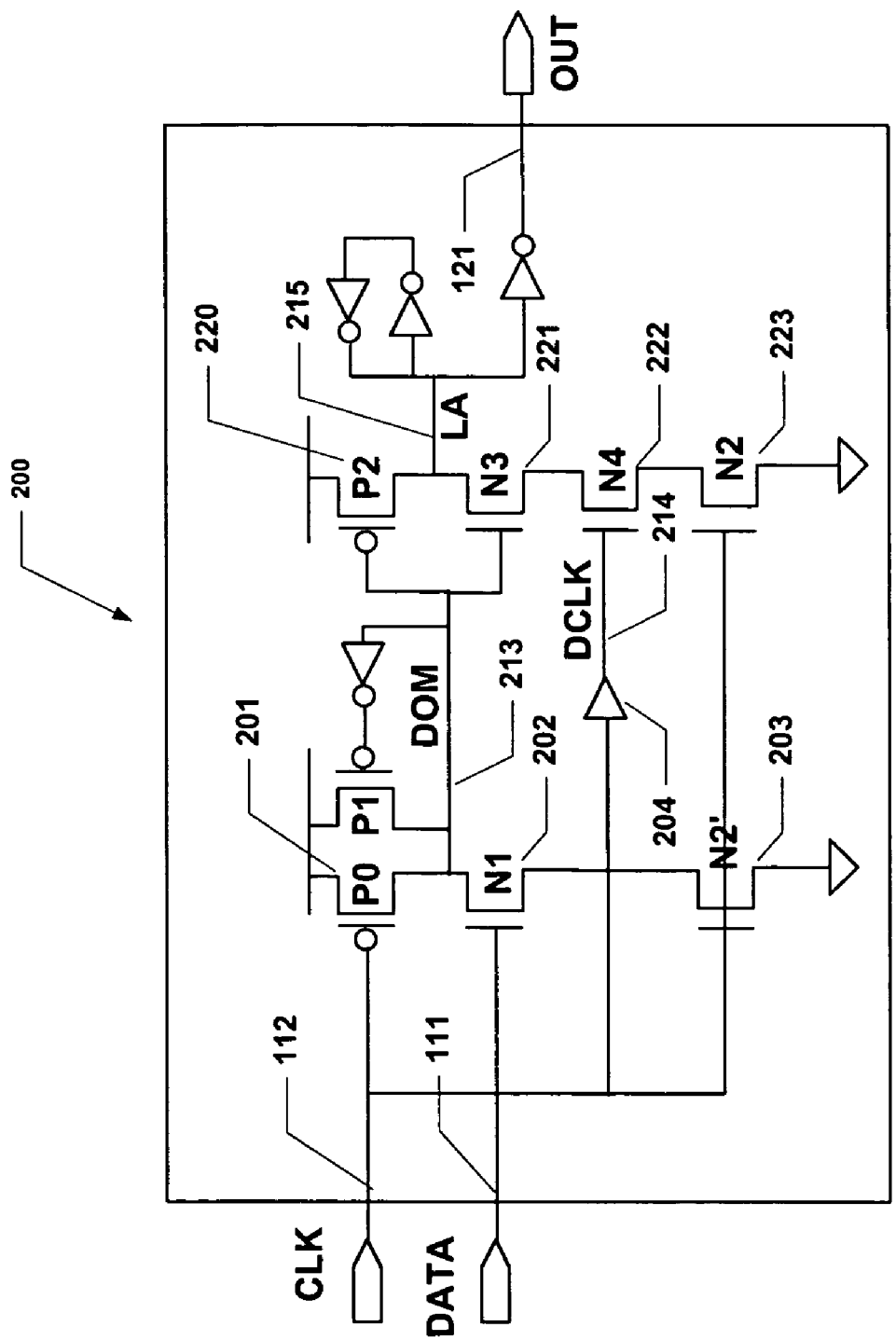
FIG. 2 is a schematic diagram illustrating an embodiment of a dynamic-to-static logic converter circuit.

FIG. 2 is a schematic diagram illustrating an embodiment of a digital-to-static converter circuit as shown in FIG. 1 in greater detail. In the embodiment of FIG. 1, a digital-to-static converter circuit is configured as a domino-to-static converter circuit 200. Domino-to-static converter circuit 200 receives input data (DATA) signal 111 and input clock (CLK) signal 112. Domino-to-static converter circuit 200 generates static logic output (OUT) signal 121, based upon input data (DATA) signal 111.

Input clock (CLK) signal 112, is electrically coupled to transistor gate inputs for pull-up PMOS transistor P0 201, and to transistor gate inputs for tail NMOS transistor N2' 203 and for tail NMOS transistor N2 223. CLK signal 112 is also electrically coupled to clock delay element 204 that generates sampling clock signal, delayed clock (DCLK) signal 214. Clock delay element 204 may take a variety of forms, such as a pair of back-to-back inverters, one or more transistors, or other elements capable of producing a desired propagation delay. During a pre-charge phase of a dynamic logic clock cycle, input clock (CLK) signal 112 corresponds to a low signal. A low input clock (CLK) signal 112 causes pull-up transistor P0 201 to pre-charge dynamic output (DOM) signal 213 at a dynamic node to a high level. A low input clock (CLK) signal 112 also causes tail transistors N2' 203 and N2 223 to remain in a tri-state.

An evaluation phase of a domino logic clock cycle begins when input clock (CLK) signal 112 rises to a high level. During this evaluation phase of the domino logic clock cycle, tail transistors N2' 203 and N2 223 provide a signal path to ground, enabling pre-charged signals to fall to a low level depending upon input data signal, input data (DATA) signal 111. Specifically, a high input data (DATA) signal 111 causes NMOS transistor N1 202 to provide a signal path for dynamic output (DOM) signal 213 to tail transistor N2' 203, and hence to ground, pulling dynamic output (DOM) signal 213 down to a logic low level. In particular, a high level for input clock (CLK) signal 112 that occurs during the evaluation phase of the domino logic clock cycle generates a signal path to ground for dynamic output (DOM) signal 213 through transistors N1 202 and N2' 203 and causes dynamic output (DOM) signal 213 to fall to its low level. A low level for input data signal, input data (DATA) signal 111 causes NMOS transistor N1 202 to remain tri-stated. In this case, dynamic output (DOM) signal 213 at the dynamic node remains charged and presents a logic high level.

When dynamic output (DOM) signal 213 is high, PMOS transistor P2 220 and NMOS transistor N3 221 are "on." As a result, latch (LA) signal 215 is pulled-up to a high level. Input clock (CLK) signal 112, in its high level evaluation phase, causes tail transistor N2 223 to turn "on." Delayed clock (DCLK) signal 214 similarly causes NMOS transistor N4 to turn "on" when delayed clock (DCLK) signal 214 also rises to a high level. However, delayed clock (DCLK) signal 214 does not transition to a high level until shortly after input clock (CLK) signal 112 has already risen. Consequently, a signal path to ground for latch (LA) signal 215 would exist through the path N3-N4-N2, but only after the evaluation phase of the dynamic clock cycle. When dynamic output (DOM) signal 213 is low, NMOS transistor N3 221 remains in a tri-state condition and latch (LA) signal 215 remains pre-charged.

Clock delay element 204 is selected to provide sufficient delay in changing signal transition for delayed clock (DCLK) signal 214 relative to input clock (CLK) signal 112 to permit the discharge of current through transistors N1 202 and N2' 203, causing dynamic output (DOM) signal 213 to fall to a low level before transistor N4 222 is activated by delayed clock (DCLK) signal 214. The introduction of this signal delay in the generation of delayed clock (DCLK) signal 214 reduces an occurrence of an erroneous static logic signal, or "glitch," when a domino logic pre-charged signal is evaluated.

Figure 3:
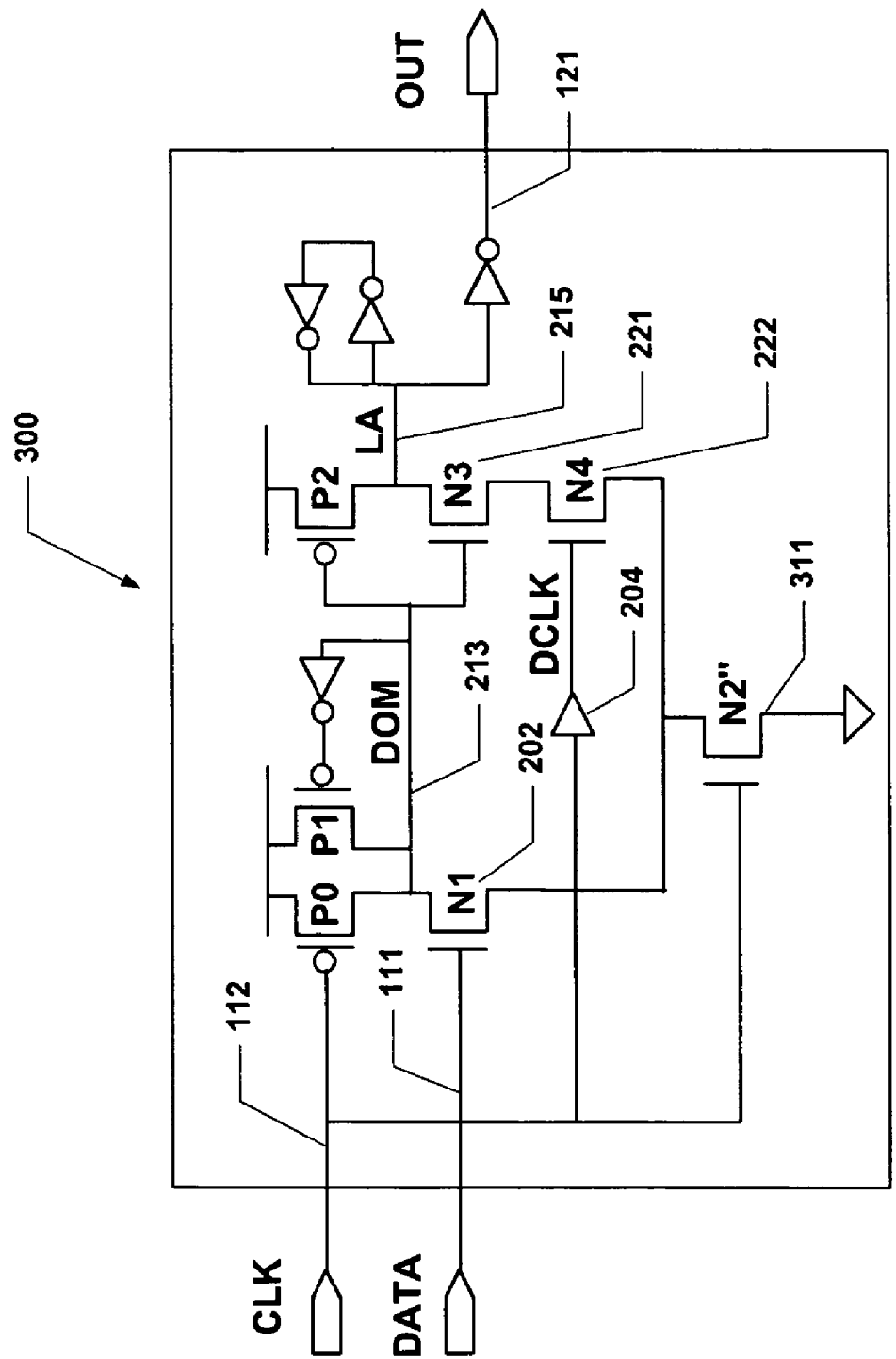
FIG. 3 is a schematic diagram illustrating another embodiment of a dynamic-to-static converter circuit.

FIG. 3 is a schematic diagram illustrating another embodiment of a domino-to-static converter circuit. Domino-to-static converter circuit 300 operates substantially similar to domino-to-static converter circuit 200 of FIG. 2, except NMOS tail transistor N2" 311 is used in place of NMOS tail transistors N2' 203 and N2 223. Because both tail transistor N2' 203 and tail transistor N2 223 are controlled by a common signal, input clock (CLK) signal 112, both transistors become active and both transistors become tri-stated simultaneously. As such, these two transistors N1, N2 may be functionally replaced by the single, common tail transistor N2" 311, as shown in FIG. 3.

NMOS transistor N2" 311 acts as current limit on a signal pat to ground from transistor N1 202 as well as transistor pair N3 221-N4 222. If transistors N1 202, N4 222, and N3 221 are identical in size and thus present identical impedance, current passing through transistor N2" 311 when both signal paths are discharging signals is divided between the two signal paths with roughly two thirds of the current flowing from transistor N1 202 and one third of the current flawing from the pair of transistors N3 221-N4 222. As such, electrical charge stored in a pre-charged transistor N1 202 discharges more quickly than electrical charge stored in transistor N3 221. If tail transistor N2" 311 acts as a limit on the current flowing from the discharge of transistors N1 202 and N3 211, the rate at which signals generated by these pre-charged transistors fails from a pre-eharged high level to a discharged low level is reduced.

If an erroneous static logic signal is propagated when dynamic output (DOM) signal 213 changes, and while a tri-state latch stack is enabled, latch (LA) signal 215 will begin to fall from a high level to a low level until dynamic output (DOM) signal 213 completes its signal propagation. Once dynamic output (DOM) signal 213 has propagated through transistor P2 220, latch (LA) signal 215 returns to its high level. The short drop in signal level for latch (LA) signal 215 during a brief period of time when dynamic output (DOM) signal 213 is propagated corresponds to the erroneous signal condition addressed by the use of clock delay element 204. Use of a current limiting tail transistor N2" 311 slows the rate at which LA signal 215 will fall, and thus reduces the amount of signal drop seen in latch (LA) signal 215 while dynamic output (DOM) signal 213 is propagated. Use of both clock delay element 204 and current limiting tail transistor N2" 311 reduces an amount of signal change seen in latch (LA) signal 215 generated by signal propagation of dynamic output (DOM) signal 213 through a dynamic logic circuit. In this manner, the circuit of FIG. 3 can avoid or mitigate the effects of a signal glitch that otherwise may be present in prior art circuits.

A similar current limiting result may be achieved using a two tail transistor circuit as shown in FIG. 2. Tail transistors N2 223 and N2' 203 may limit current flow from pre-charged domino logic signals through proper sizing of transistors N2 223 and N2' 203. As such, one skilled in the art will appreciate that use of current limiting tail transistors to slow a signal fall rate for a pre-charged domino logic signal may be achieved using either a single transistor or a multiple transistor circuit design without departing from the spirit and scope of the disclosure.

Figure 4:
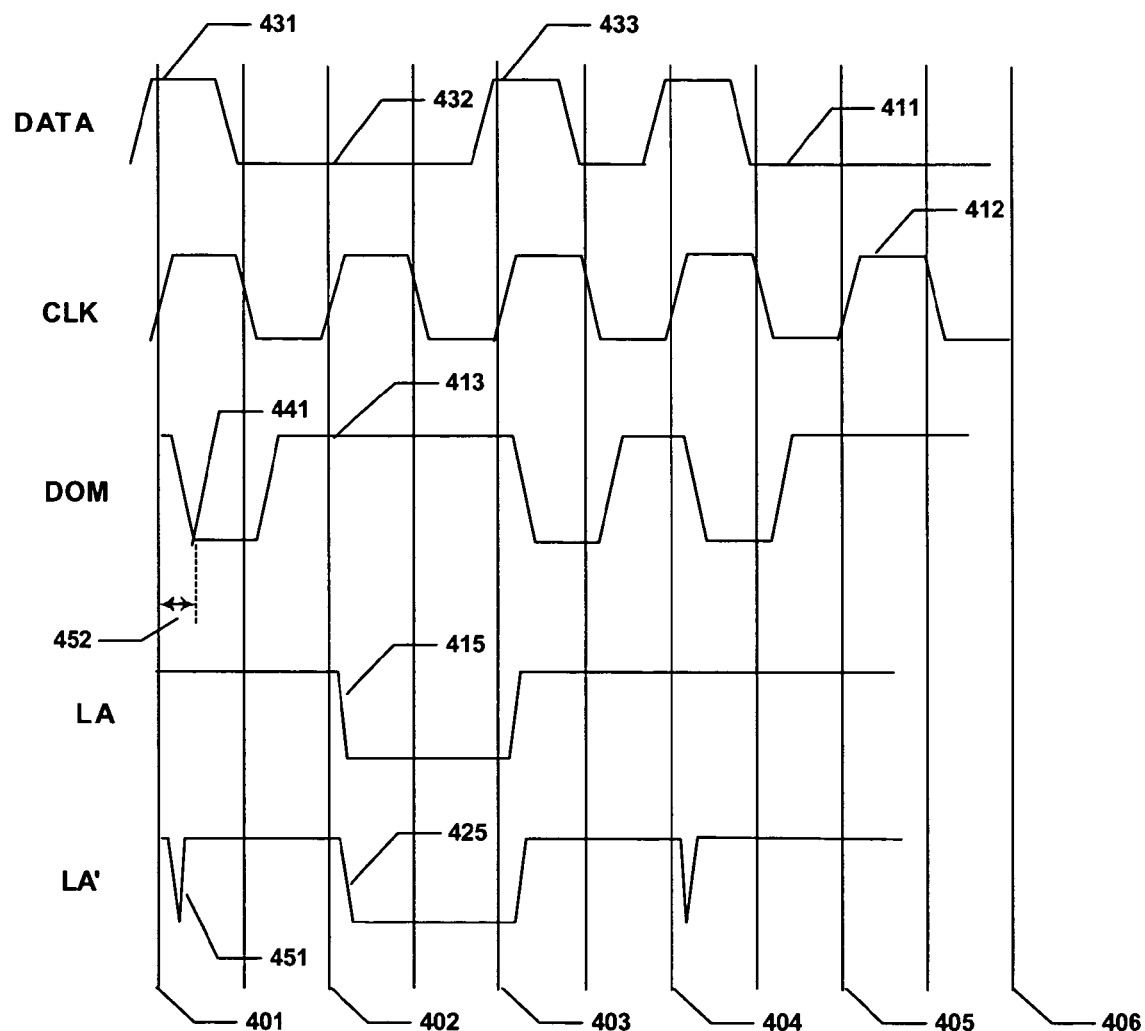
FIG. 4 is a timing diagram illustrating signal timing within a dynamic-to-static converter circuit.

FIG. 4 is a schematic diagram illustrating signal timing within a dynamic-to-static converter circuit. Signal timing waveforms are shown in FIG. 4 for input data (DATA) signal waveform 411, input clock (CLK) signal waveform 412, dynamic output (DOM) signal waveform 413, latch (LA) signal waveform 415 and LA' signal waveform 425 as seen in domino-to-static converter circuits of FIG. 2 and FIG. 3. Input data (DATA) signal waveform 411 corresponds to input data (DATA) signal 111 received by domino-to-static converter circuit 200. Input Clock (CLK) signal waveform 412 corresponds to a input clock (CLK) signal 111 received by into domino-to-static converter circuit 200. Dynamic output (DOM) signal waveform 413 corresponds to dynamic output (DOM) signal 213 generated within domino-to-static converter circuit 200. Latch (LA) signal waveform 415 corresponds to latch (LA) signal 215 generated within domino-to-static converter circuit 200. Latch (LA') signal waveform 425 corresponds to a version of latch (LA) signal 215 generated within domino-to-static converter circuit 200 where a clock element module 204 generates delayed clock (DCLK) signal 114 to prevent propagation of an erroneous static logic signal.

Each of the signal waveforms are shown over a five clock cycle time period beginning at $t_0$ 401 and ending at $t_5$ 406. Each of the five clock cycle time period $t_0$ 401–$t_5$ 406 begins on a rising edge of input clock (CLK) signal 112 as illustrated in input clock (CLK) signal waveform 412. Each of the five clock cycle time periods correspond to two half-cycles of $\Delta t$. Input data (DATA) signal waveform 411 represents input data (DATA) signal 111 input into domino-to-static converter circuit 200. Input data (DATA) signal waveform 411 shows that input data (DATA) signal 111 changes state, if necessary, prior to a rising edge of input clock (CLK) signal waveform 412 such that input data (DATA) signal 111 is stable at $t_0$ 401, $t_1$ 402, $t_2$ 403, $t_3$ 404, $t_4$ 405, and $t_5$ 406. As shown in input data (DATA) signal waveform 411, input data (DATA) signal 111 has completed its transition from a low state to a high state when $t_0$ 431 occurs and when $t_2$ 433 occurs. Input data (DATA) signal 111 remains in a low state when $t_1$ 432 occurs.

As described above in reference to FIG. 2, dynamic output (DOM) signal 213 as shown in dynamic output (DOM) signal waveform 413 falls from a high level to a low level 441 when both input data (DATA) signal 111 and input clock (CLK) signal 112 are high as occurs between $t_0$ and $t_0+\Delta t$. Dynamic output (DOM) signal 113 falls as transistors N1 202 and N2' 203 are on during the time period. Dynamic output (DOM) signal 113 remains in a low state until after CLK signal falls to a low state at $t_0+t$. Clock delay module 204 generates a sampling clock signal in which input clock (CLK) signal 112 rising and falling edges are delayed by a period of time Dt. This delay period Dt permits dynamic output (DOM) signal 215 to fall to its low state 441 before delayed clock (DCLK) signal 214 turns on transistor N4 222. As such, dynamic output (DOM) signal 213, in a low state, turns off transistor N3 221 before delayed clock (DCLK) signal 214 turns on transistor N2 223. As a result, latch (LA) signal 215 shown in latch (LA) signal waveform 415 does not fall from its high level at $t_0$ 401.

If delay period Dt is less than the fall time for dynamic output (DOM) signal 213, dynamic output (DOM) signal 213 activates transistor N3 221 to an "on" state when delayed clock (DCLK) signal 214 turns on transistor N4 222 that permits latch (LA) signal 215 to begin to fall as charge is discharged through transistors N3-N4-N2 until dynamic output (DOM) signal 213 has fallen sufficiently to turn off transistor N3 221. When transistor N3 221 turns off, latch (LA) signal 215 rises back to its high state. Latch (LA') signal waveform 425 illustrates such a signal when Dt delay between rising edges of CLK signal 112 and delayed clock (DCLK) signal 214 is less than the signal propagation for dynamic output (DOM) signal 213 through transistor N1 202. A short pulse 451 corresponding to an erroneous static logic signal results from the above condition. When delay time Dt is greater than a minimum DCLK delay period 451 corresponding to time required for dynamic output (DOM) signal 213 to fall from its high state to its low state, the short pulse 451 is not generated.

The erroneous static logic signal arises only when dynamic output (DOM) signal 213 falls from a high to a low state. Since dynamic output (DOM) signal 213 falls in response to a clock cycle in which input data (DATA) signal 111 is high, the erroneous static logic signal does not occur during clock cycle time periods, such as t1 402 to t2 403, in which input data (DATA) signal 111 is low. As such, delay time Dt does not affect latch (LA) signal 215 during this time period.

Figure 5:
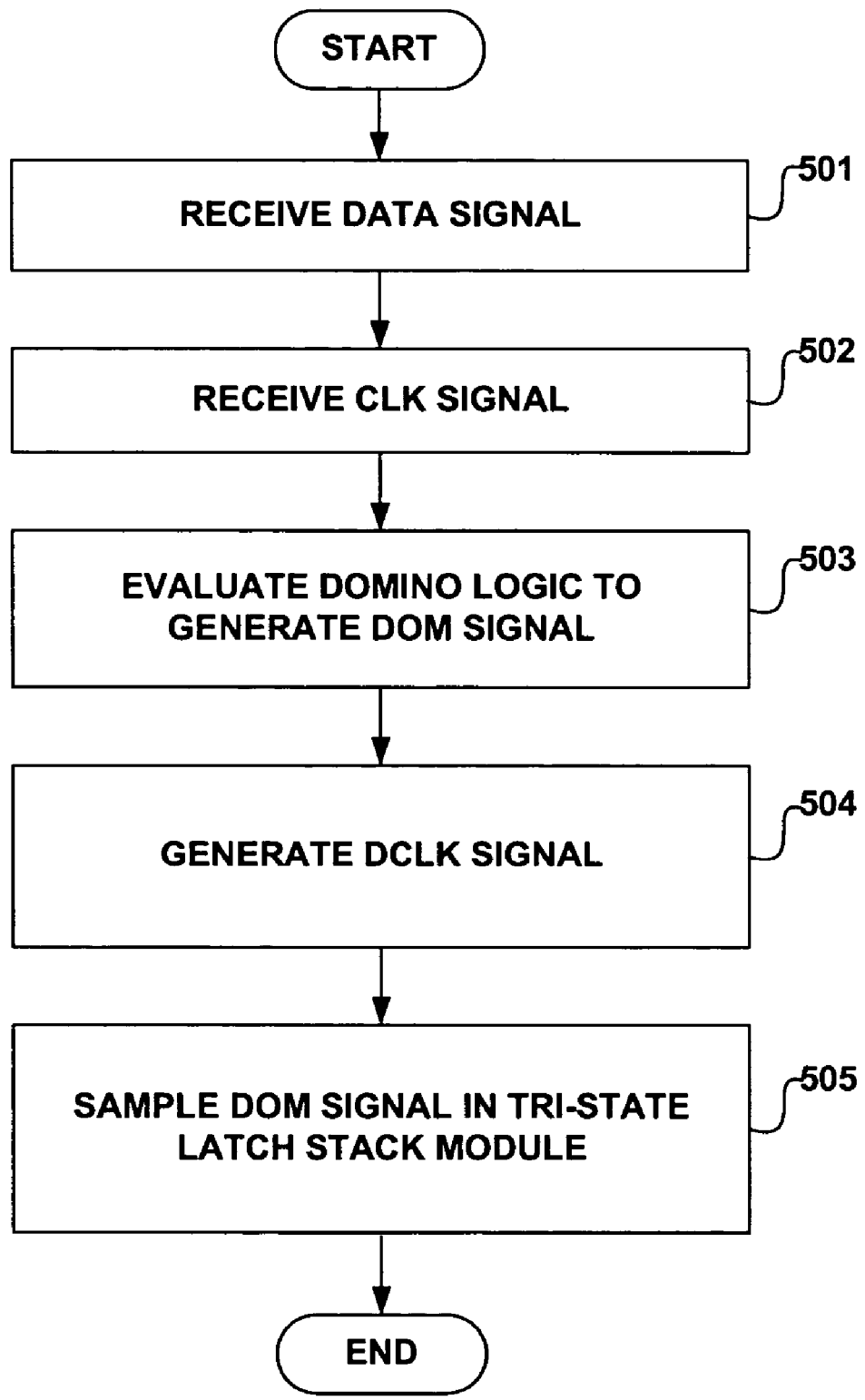
FIG. 5 is a flow chart illustrating an example mode of operation for an example embodiment of a dynamic-to-static converter circuit.

FIG. 5 is a flow chart illustrating an example mode of operation for an example embodiment of a domino-to-static converter circuit. Domino-to-static converter circuit 200 receives a dynamic input signal (501), input data (DATA) signal 111, and receives a clocking signal (502), input clock (CLK) signal 112, in which input clock (CLK) signal 112 defines a pre-charge phase and an evaluation phase of a clock cycle time period used to process and propagate dynamic logic signals.

During the evaluation phase of the clock cycle time period, a dynamic logic circuit 101, generates a dynamic logic signal (503), dynamic output (DOM) signal 113. Dynamic output (DOM) signal 113, when sampled by input clock (CLK) signal 112, provides a representation of a logic signal during a particular clock cycle time period. During the pre-charge phase of the of the clock cycle time period, dynamic output (DOM) signal 113 is pre-charges to a high signal level in anticipation of the evaluation phase of the clock cycle time period.

A clock delay element 103 uses input clock (CLK) signal 112 to generate a delayed clock signal (504), delayed clock (DCLK) signal 114, for use in sampling dynamic output (DOM) signal 113 by a Tri-state latch stack module 102 (505). Delayed clock (DCLK) signal 114 delays input clock (CLK) signal 112 by a delay time period, Dt, permitting dynamic output (DOM) signal 113 to propagate through dynamic logic circuit 101 and become a stable, non-changing logic signal before latch circuit 102 samples dynamic output (DOM) signal 113.

Latch circuit 102 generates a static logic output signal, latch (LA) signal 215 that may be buffered for output as a static logic signal 121. Tri-state latch stack module 102 captures dynamic output (DOM) signal 113 and generates its output signals, Latch (LA) signal 215 and static logic output (OUT) signal 121, during a delayed evaluation phase of the clock cycle time period. A previously captured output signal, static logic output (OUT) signal 121, is maintained and output by tri-state latch stack module 102 during a delayed pre-charge phase of the clock cycle time period in order to generate a static logic signal throughout the entire clock cycle time period.

A dynamic-to-static logic converter in accordance with this disclosure may be utilized in converting dynamic logic signals, such as logic signals in within domino-logic circuits, to static logic signals. These uses of dynamic-to-static logic converter circuits are found in many circuit designs such as integrated memory circuits and within programmable processor circuits. In one embodiment, a dynamic-to-static logic converter of this disclosure is used within a circuit design for an L1 cache memory circuit used in a digital signal processing (DSP) circuit. One skilled in the art will recognize that many other circuits may use the dynamic-to-static logic converter circuits according to the disclosure.

Example hardware implementations for functional components described herein may include integrated and discrete logic circuitry that use various logic gates and related transistor circuit elements in constructing dynamic and static logic circuits. Domino-to-static converter circuits as described herein may be useful in a variety of devices, including high-speed logic circuitry, telecommunication devices, and other circuitry requiring conversion of dynamic logic circuitry to static logic circuitry.

Various embodiments have been described. Numerous other modifications may be made without departing from the spirit and scope of this disclosure. These and other embodiments are within the scope of the following claims.

The invention is claimed:

1. A dynamic-to-static logic convener circuit comprising:
   a dynamic logic circuit that generates a dynamic logic signal in response to a clock signal;
   a clock delay element that delays the clock signal;
   a latch circuit that samples the dynamic logic signal to generate a static logic signal in response to the delayed clock signal; and
   further comprising a current limiting transistor, coupled to both the dynamic logic circuit and the latch circuit, to provide a current limit on a signal path to ground for the dynamic logic circuit and the latch circuit such that a transistor in the dynamic logic circuit discharges faster than a transistor in the latch circuit when both the dynamic logic circuit and latch circuit are enabled.

2. The dynamic-to-static logic converter circuit according to claim 1, wherein the current limiting transistor comprises a tail transistor, responsive to the clock signal, that disables the latch circuit during a pre-charge phase of the dynamic logic circuit.

3. The dynamic-to-static logic converter circuit according to claim 1, wherein the dynamic logic circuit includes a domino inverter stack, and the delay period is greater than a signal propagation delay through the domino inverter stack.

4. The dynamic-to-static logic convener circuit according to claim 1, wherein the latch circuit includes a tri-state latch stack.

5. The dynamic-to-static logic converter circuit according to claim 1, wherein the dynamic logic circuit includes a pre-charge gate that pre-charges a dynamic node, a pull-down logic gate that pulls down the dynamic node in response to an input logic signal, and an evaluation gate that pulls down the logic gate in response to the clock signal.

6. The dynamic-to-static logic convener circuit according to claim 1, wherein the current limiting transistor causes the signal propagation delay through the dynamic logic circuit to be less than a signal propagation delay of the static logic signal.

7. A method for convening a dynamic logic signal to a static logic signal, the method comprising:
  generating a dynamic logic signal in response to a clock signal;
  delaying the clock signal; and
  sampling the dynamic logic signal in response to the delayed clock signal to generate a static logic signal
  providing a current limit on a signal path to ground for the dynamic logic circuit and the latch circuit through a current limiting transistor coupled to both the dynamic logic circuit and the latch circuit such that a transistor in the dynamic logic circuit discharges faster than a transistor in the latch circuit when both the dynamic logic circuit and latch circuit are enabled.

8. The method according to claim 7, wherein sampling the dynamic logic signal comprises sampling the dynamic logic signal with a latch circuit.

9. The method according to claim 7, wherein generating the dynamic logic signal comprises generating the dynamic logic signal with a dynamic logic circuit.

10. The method according to claim 7, wherein sampling the dynamic logic signal comprises sampling the dynamic logic signal with a latch circuit, and generating the dynamic logic signal comprises generating the dynamic logic signal with a dynamic logic circuit, the method further comprising disabling the latch circuit during a pre-charge phase of the dynamic logic circuit in response to the clock signal.

11. The method according to claim 10, wherein the latch circuit includes a tri-state latch stack.

12. The method according to claim 10, wherein the dynamic logic circuit includes a domino inverter stack, and delaying the clock signal includes delaying the clock signal by a delay period greater than a signal propagation delay through the domino inverter stack.

13. The method according to claim 7, wherein sampling the dynamic logic signal comprises sampling the dynamic logic signal with a tri-state latch circuit, and generating the dynamic logic signal comprises generating the dynamic logic signal with a domino logic circuit, the method further comprising:
  limiting current flow through the domino logic circuit to control a signal propagation delay through the domino logic circuit; and
  limiting current flow through the tri-state latch circuit to control a signal propagation delay of the static logic signal through the ti-state latch circuit;
  wherein the signal propagation delay through the domino logic circuit is less than the signal propagation delay of the static logic signal.

* * * * *